United States Patent
Mulder

(10) Patent No.: US 9,362,940 B2
(45) Date of Patent: Jun. 7, 2016

(54) PARALLEL SAMPLE-AND-HOLD CIRCUIT FOR A PIPELINED ADC

(71) Applicant: Broadcom Corporation, Irvine, CA (US)

(72) Inventor: Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/565,017

(22) Filed: Dec. 9, 2014

(65) Prior Publication Data

US 2016/0105195 A1 Apr. 14, 2016

Related U.S. Application Data

(60) Provisional application No. 62/062,533, filed on Oct. 10, 2014.

(51) Int. Cl.
*H03M 1/00* (2006.01)
*H03M 1/46* (2006.01)
*G11C 27/02* (2006.01)

(52) U.S. Cl.
CPC ............... *H03M 1/468* (2013.01); *G11C 27/02* (2013.01); *H03M 1/002* (2013.01)

(58) Field of Classification Search
CPC .... G11C 27/02; G11C 11/565; G11C 7/1039; H03M 1/002; H03M 1/468; H03M 1/00; H03M 1/0695; H03M 1/08; H03M 1/442; H03M 3/342; H03M 3/424; H03M 3/452; H03M 3/458

USPC .................................................. 341/118–122
See application file for complete search history.

(56) References Cited

U.S. PATENT DOCUMENTS

| | | | | |
|---|---|---|---|---|
| 7,009,549 | B1* | 3/2006 | Corsi | H03M 1/08 341/118 |
| 7,167,119 | B1* | 1/2007 | Lei | H03M 3/342 341/143 |
| 7,319,419 | B1* | 1/2008 | Lash | H03M 1/0607 341/118 |
| 7,896,859 | B2* | 3/2011 | Daly | A61J 1/1406 604/410 |
| 2012/0274400 | A1* | 11/2012 | Cheng | H03M 1/002 330/127 |

* cited by examiner

*Primary Examiner* — Jean B Jeanglaude
(74) *Attorney, Agent, or Firm* — Sterne, Kessler, Goldstein & Fox P.L.L.C.

(57) ABSTRACT

A parallel sample-and-hold circuit includes a sampling switch and a hold capacitor for each of the ADC and MDAC of a converter stage for a pipelined ADC. Each sampling switch couples the analog input of the first converter stage to its hold capacitor at the time a sample is desired to be taken. After the sample is placed on the hold capacitor, the sampling switch is opened and the hold capacitor stores the sample. To compensate for mismatches in the signal paths of these sample-and-hold circuits, a compensation switch is further used. The compensation switch couples the terminals of the hold capacitors together, creating a parallel sample-and-hold circuit. The compensation switch is controlled such that it is closed after the sampling switches are opened to equalize a voltage of the samples.

20 Claims, 4 Drawing Sheets

US 9,362,940 B2

PARALLEL SAMPLE-AND-HOLD CIRCUIT FOR A PIPELINED ADC

CROSS REFERENCE TO RELATED APPLICATIONS

This application claims the benefit of U.S. Provisional Patent Application No. 62/062,533, filed Oct. 10, 2014, which is incorporated by reference herein.

TECHNICAL FIELD

This application relates generally to sample-and-hold circuits, including sample-and-hold circuits for pipelined analog-to-digital converters (ADCs).

BACKGROUND

The pipelined ADC is a common architecture used to convert analog signals to digital signals at, for example, resolutions of 8-16 bits and conversion speeds ranging from 1-5000 Mega-samples per second (MS/s). Typical applications include digital receivers, digital imaging, and digital video.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

Figure 1:
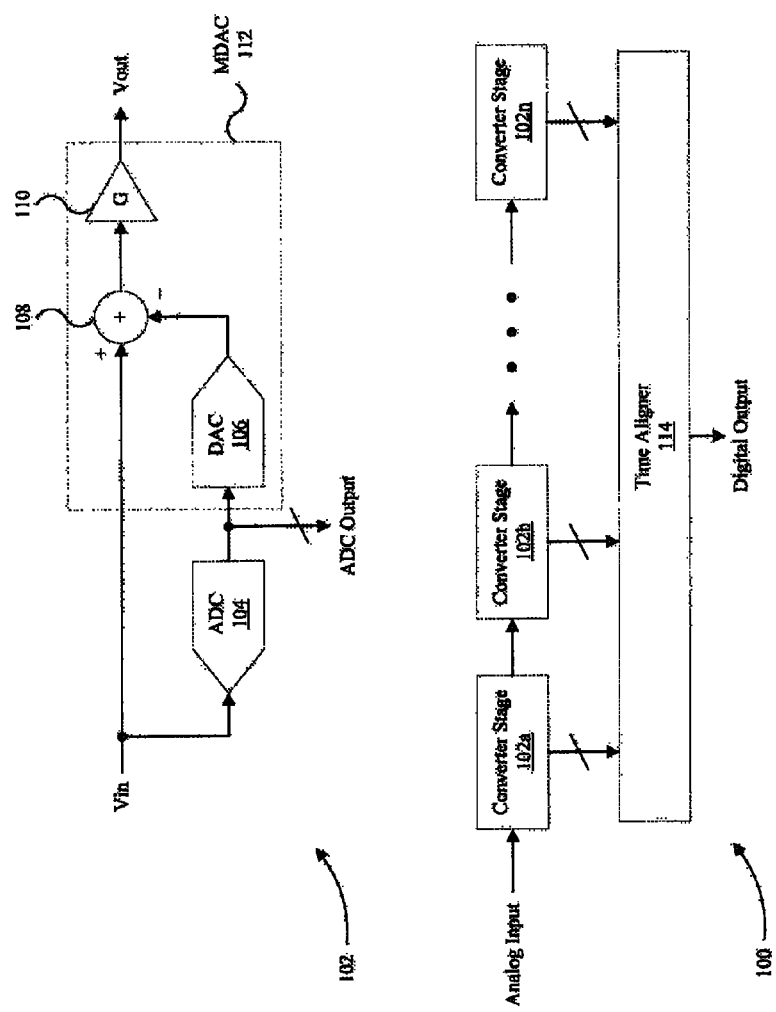
FIG. 1 illustrates a block diagram of a pipelined ADC.

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include software, firmware, or hardware (such as one or more circuits, microchips, processors, and/or devices), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

I. Overview

A pipelined ADC is constructed from a series of cascaded converter stages that sequentially process an analog input signal to convert the analog input signal into a digital output signal. Each converter stage performs a coarse analog-to-digital conversion of a sample of its analog input using an ADC. A multiplying digital-to-analog converter (MDAC) then computes the error of the conversion performed by the ADC by converting the output of the ADC back into the analog domain and subtracting the resultant value from another sample of the converter stage's analog input that, ideally, is the same as the sample converted by the ADC. The error value, referred to as the residue, is then amplified and fed to the next converter stage to extract additional bits. The ADC outputs from each converter stage are aligned in time and combined using a time aligner to yield the final digital output.

Often, the analog input of the first converter stage in a pipelined ADC is sampled by both the ADC and the MDAC with different sampling circuits. Mismatches (e.g., resistive, capacitive, and threshold mismatches) in the signal paths of the sampling circuits can result in different samples of the analog input of the first converter stage being taken by the ADC and the MDAC and, consequently, a larger than expected residue being determined. Because the residue is larger than expected, amplification of the residue by the MDAC can result in over-range of the amplifier used to perform the amplification, which can further result in reduced linearity of the pipelined ADC. The issue of reduced linearity is often further exacerbated as the resolution of the converter stage is increased.

The present disclosure is directed to a parallel sample-and-hold circuit that can be used in the first converter stage (and others) to reduce power consumption, increase resolution, and/or improve accuracy of the pipelined ADC. The parallel sample-and-hold circuit includes a sampling switch and a hold capacitor for each of the ADC and MDAC of the converter stage. Each sampling switch couples the analog input of the first converter stage to its respective hold capacitor at the time a sample is desired to be taken. After the sample is placed on the hold capacitor, the sampling switch is opened and the hold capacitor stores the sample. Under ideal circumstances, theses two sample-and-hold circuits of the ADC and MDAC take and store a same sample of the analog input on their respective hold capacitors.

To compensate for mismatches in the signal paths of the sample-and-hold circuits of the ADC and MDAC, a compensation switch is further used. The compensation switch couples together the terminals of the hold capacitors that store the samples of the analog input, creating a parallel sample-and-hold circuit from the two, separate sample-and-hold circuits of the ADC and MDAC. The compensation switch is controlled such that it is closed after the sampling switches are opened to equalize a voltage of the samples placed on the hold capacitors. These and other features of the present disclosure are described further below.

II. Pipelined ADC

FIG. 1 illustrates a block diagram of a pipelined ADC 100. As shown in FIG. 1, pipelined ADC 100 includes n cascaded converter stages 102a-102n that sequentially process an analog input signal to convert the analog input signal into a digital output signal. An exemplary configuration of a converter stage 102 is shown at the top of FIG. 1 in further detail.

In general, each converter stage 102 performs a coarse analog-to-digital conversion of a sample of its analog input Vin using an ADC 104. The error of the conversion performed by ADC 104 is computed by converting the output of ADC 104 back into the analog domain using a digital-to-analog converter (DAC) 106 and subtracting the output of DAC 106 from an additional sample of the analog input Vin using subtractor 108. The additional sample of the analog input Vin is ideally the same as the sample of the analog input converted by ADC 104. The resultant error value output by subtractor 108, referred to as the residue, is then amplified by amplifier 110 and fed to the next converter stage to extract additional bits.

The components of DAC 106, subtractor 108, and amplifier 110 are collectively referred to as a multiplying DAC (MDAC) 112. The final converter stage 102n may contain only an ADC 104 because there is no need to compute any further residue. The ADC outputs from each converter stage 102a-102n are aligned in time and combined using a time aligner 114 to yield the final digital output.

Figure 2:
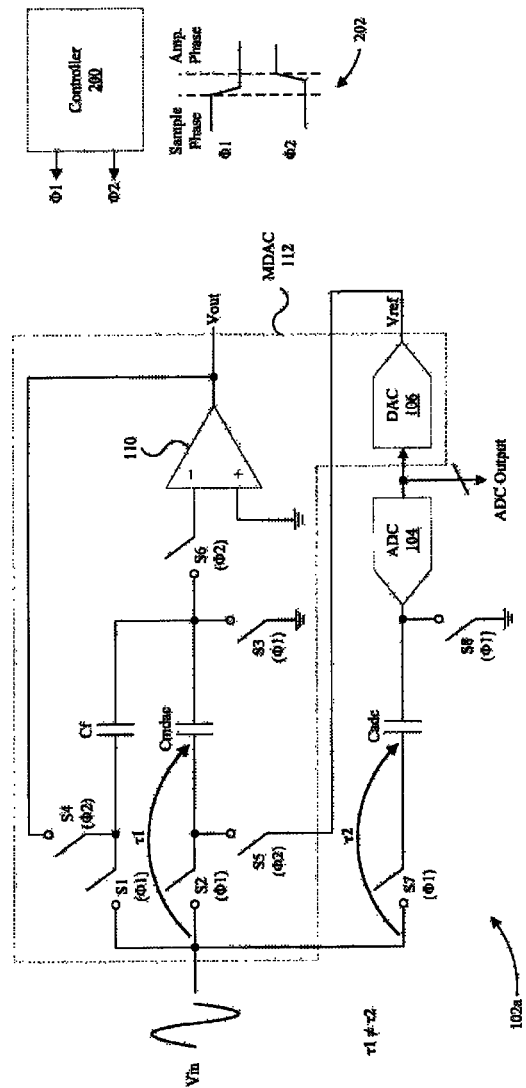
FIG. 2 illustrates a converter stage of a pipelined ADC with separate sample-and-hold circuits for the MDAC and ADC.

Two blocks of the first converter stage 102a are the sample-and-hold circuits (not shown) of ADC 104 and MDAC 112 used to sample the analog input Vin. FIG. 2 illustrates further, exemplary implementation details of the first converter stage 102a, including the sample-and-hold circuits of ADC 104 and MDAC 112. At least two non-overlapping clock signals, labeled as $\phi1$ and $\phi2$ in FIG. 2, are used to control switches S1-S6 (e.g., transistors) to operate converter stage 102a in two phases: a sampling phase and an amplification phase. These two clock signals are provided by a controller 200 with exemplary waveforms 202. Controller 200 can be implemented using hardware and/or software (stored in a memory and running on a processor).

During the sampling phase, clock signal $\phi1$ controls switches S1, S2, and S3 to be closed, and clock signal $\phi2$ controls switches S4, S5, and S6 to be open. Because switches S1, S2, and S3 are closed, the analog input Vin is sampled with respect to ground potential onto both capacitors Cf and Cmdac. After the sampling phase, the voltage across capacitors Cf and Cmdac is substantially equal to Vin, the charge stored on capacitor Cf is substantially equal to Qf=Vin*Cf, and the charge stored on capacitor Cmdac is substantially equal to Qmdac=Vin*Cmdac.

During the amplification phase, clock signal $\phi2$ controls switches S4, S5, and S6 to be closed, and clock signal $\phi1$ controls switches S1, S2, and S3 to be open. Capacitor Cf becomes a feedback capacitor coupled between the output (labeled as Vout in FIG. 2) and input of amplifier 110, and capacitor Cmdac samples the DAC output voltage Vref from DAC 106. If Vref differs from the sample of Vin, charge sharing between capacitors Cf and Cmdac occurs during the amplification phase. After the amplification phase, the voltage across capacitor Cf is substantially equal to Vout, the voltage across capacitor Cmdac is substantially equal to Vref, the charge stored on capacitor Cf is substantially equal to Qf=−Cf*Vout, and the charge stored on capacitor Cmdac is substantially equal to Qmdac=−Cmdac*Vref.

Because of charge conservation, the resultant output of MDAC 112 after the amplification phase can be determined by equating the sum of charge on capacitors Cmdac and Cf after the sampling phase to the sum of charge on capacitors Cmdac and Cf after the amplification phase, which is given by:

$$-Cf*Vin - Cmdac*Vin = -Cf*Vout - Cmdac*Vref \qquad (1)$$

where the positive polarity sign of the charge on capacitors Cmdac and Cf points toward the summing node of amplifier 110 at virtual ground. Solving for the residue output voltage Vout, the operation of MDAC 200 amounts to $$Vout = Vin\frac{Cf + Cmdac}{Cf} - Vref\frac{Cmdac}{Cf} \qquad (2)$$

Thus, MDAC 112 provides a residue output voltage Vout that is given by the difference between Vin and Vref with some gain determined by the values of capacitors Cmdac and Cf. This functionality is consistent with DAC 106, subtractor 108, and amplifier 110 described above with respect to FIG. 1.

Often, the analog input Vin of the first converter stage in a pipelined ADC is sampled by both the ADC and the MDAC with different sampling circuits. This is the case shown in FIG. 2. In particular, switch S2 and capacitor Cmdac form the sampling circuit of MDAC 112, and switch S7 and capacitor Cadc form the sampling circuit of ADC 104. Switches S2 and S7 are both controlled to be opened or closed by the same clock signal $\phi1$ and can be referred to as sampling switches, and capacitors Cmdac and Cadc can be referred to as hold capacitors. Switch S8 can be controlled in a similar manner as S3.

Mismatches (e.g., resistive, capacitive, and switch threshold mismatches) in the signal paths of these sampling circuits can result in different samples of the analog input Vin being taken by ADC 104 and MDAC 112 and, consequently, a larger than expected residue being determined. For example, because of resistive and capacitive differences of the signal paths, their respective path delays (shown as $\tau1$ and $\tau2$, respectively, in FIG. 2) may be different, causing different samples of the analog input Vin being taken by ADC 104 and MDAC 112. This is especially true for a high frequency analog input Vin. Because the residue is larger than expected due to mismatches, amplification of the residue by MDAC 112 can result in over-range (or saturation) of amplifier 110, which can further result in reduced linearity of the pipelined ADC. The issue of reduced linearity is often further exacerbated as the resolution of converter stage 102a is increased.

Described below is a parallel sample-and-hold circuit that can be used in converter stage 102a (and others) to reduce power consumption, increase resolution, and/or improve accuracy of the pipelined ADC.

III. Pipelined ADC with Parallel Sample-and-Hold Circuit

Figure 3A:
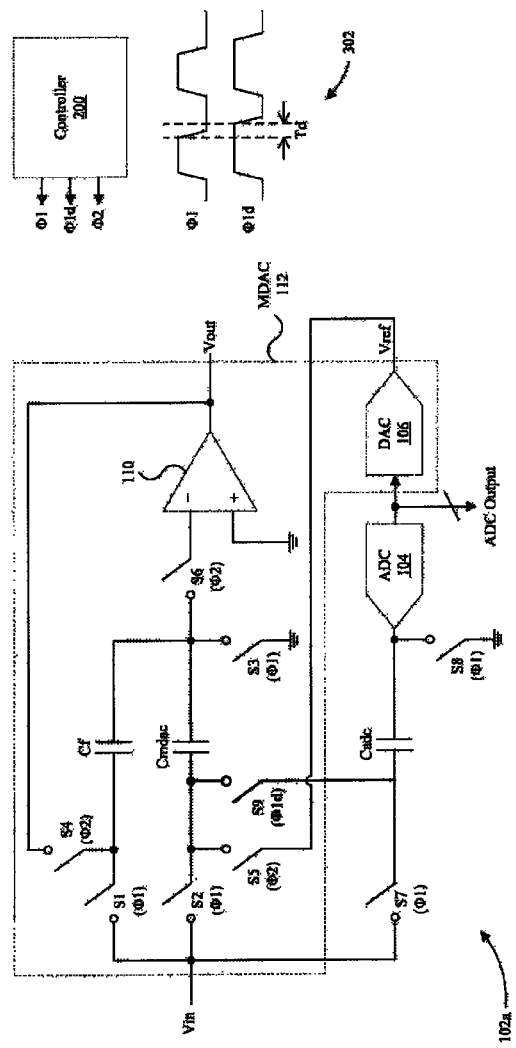
FIG. 3A illustrates a converter stage of a pipelined ADC with a parallel sample-and-hold circuit for the MDAC and ADC in accordance with embodiments of the present disclosure.

Referring now to FIG. 3A, the same example implementation of first converter stage 102a is shown, but with the addition of a new switch S9 coupled between the terminals of the hold capacitors Cmdac and Cadc that store the samples of the analog input Vin. Switch S9 creates a parallel sample-and-hold circuit from the two, separate sample-and-hold circuits of ADC 104 and MDAC 112 and is configured to compensate for mismatches in the signal paths of the two sample-and-hold circuits. Because switch S9 is configured to compensate for mismatches it can be referred to as a compensation switch.

The compensation switch S9 is controlled such that it is closed after the sampling switches S2 and S7 are opened to equalize a voltage of the samples placed on the hold capacitors. While the compensation S9 is closed and the sampling switches S2 and S7 are opened, the voltages on hold capacitors Cmdac and Cadc equilibrate to some intermediate value. More specifically, if the two capacitors are charged to different voltages, charge sharing will occur to force their voltages equal at some intermediate value.

Figure 3B:
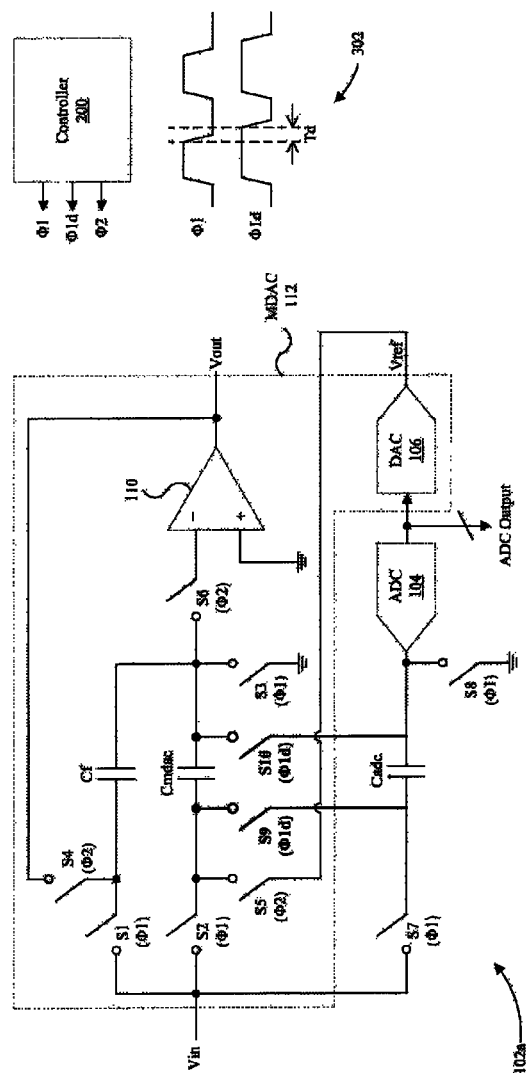
FIG. 3B illustrates the converter stage of the pipelined ADC of FIG. 3A with an additional compensation switch in accordance with embodiments of the present disclosure.

In one embodiment, controller 200 can be modified to provide an additional clock signal $\phi 1d$ as shown in FIG. 3B. Clock signal $\phi 1d$ can be used to control compensation switch S9 such that compensation switch S9 is closed (or remains closed) for some period of time Td after sampling switches S2 and S7 are opened (and before sampling switches S2 and S7 are once again closed) to equalize the voltages on hold capacitors Cmdac and Cadc. By closing compensation switch S9 while sampling switches S2 and S7 are closed, the amount of time Td required to ensure that the voltages on hold capacitors Cmdac and Cadc are equal can be reduced. Reducing the time Td can be important because the amplification phase described above generally cannot begin until compensation switch S9 is opened.

In another embodiment, controller 200 can be modified to provide the additional clock signal $\phi 1d$ such that compensation switch S9 closes and opens for a period of time Td while sampling switches S2 and S7 are opened to equalize the voltages on hold capacitors Cmdac and Cadc.

It should be noted that the example implementation of first converter stage 102a is provided by way of example only. One of ordinary skill in the art will appreciate that other implementations of first converter stage 102a are possible and can be used with the parallel sample-and-hold circuit described herein. For example, first converter stage 102a can be implemented such that it receives and processes a differential analog input Vin as opposed to a single ended analog input Vin. In another example, MDAC 112 of first converter stage 102a can be implemented as a non-flip-around type MDAC as opposed to the flip-around type shown in FIG. 3A. In the flip-around type MDAC 112, the feedback capacitor Cf is used to sample the analog input Vin using switch S1 as described above. This sample-and-hold circuit suffers from the same issue of mismatch as the other two sample-and-hold circuits described above and can be compensated for using another compensation switch coupled between the terminal of feedback capacitor Cf storing the sample of the analog input Vin and either the terminal of capacitor Cmdac or Cadc storing a similar sample of the analog input Vin. In a non-flip-around type MDAC, feedback capacitor Cf is usually coupled to ground through switch S1 (as opposed to the analog input) and therefore will not need such compensation.

It should be further noted that the parallel sample-and-hold circuit described herein can be used in other ADC architectures. For example, successive approximation ADCs that use parallel sampling capacitors or that split the input sampling capacitor into a small part for initial conversion and a large part for low thermal noise can beneficially use the parallel sample-and-hold circuit described herein.

Referring now to FIG. 3B, the same example implementation of first converter stage 102a in FIG. 3A is shown, but with the addition of a second compensation switch S10 coupled between the remaining terminals of the hold capacitors Cmdac and Cadc. Similar to compensation switch S9, compensation switch S10 creates a parallel sample-and-hold circuit from the two, separate sample-and-hold circuits of ADC 104 and MDAC 112 and is configured to compensate for mismatches in the signal paths of the two sample-and-hold circuits to equalize the voltages on the remaining terminals of the hold capacitors Cmdac and Cadc. In an embodiment, the same clock signal $\phi 1d$ used to control switch S9 can be used to control switch S10.

IV. Conclusion

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A converter stage for a pipelined analog-to-digital converter (ADC), comprising:
   an ADC configured to convert a first sample of an analog signal into a digital value, wherein the ADC comprises a first sampling switch configured to couple the analog signal to a first hold capacitor to store the first sample of the analog signal on the first hold capacitor;
   a multiplying digital-to-analog converter (MDAC) configured to convert the digital value into an analog value and subtract the analog value from a second sample of the analog signal to provide a residue, wherein the MDAC comprises a second sampling switch configured to couple the analog signal to a second hold capacitor to store the second sample of the analog signal on the second hold capacitor;
   a first compensation switch coupled between a first terminal of the first hold capacitor and a first terminal of the second hold capacitor; and
   a second compensation switch coupled between a second terminal of the first hold capacitor and a second terminal of the second hold capacitor.

2. The converter stage of claim 1, wherein the first compensation switch is configured to equalize a voltage of the first sample of the analog signal on the first hold capacitor with a voltage of the second sample of the analog signal on the second hold capacitor.

3. The converter stage of claim 1, wherein the first compensation switch is configured to equalize a voltage on the first terminal of the first hold capacitor with a voltage on the first terminal of the second hold capacitor.

4. The converter stage of claim 1, wherein the second compensation switch is configured to equalize a voltage on the second terminal of the first hold capacitor with a voltage on the second terminal of the second hold capacitor.

5. The converter stage of claim 1, further comprising a controller configured to provide a first control signal to control the first and second sampling switches and a second control signal to control the first and second compensation switches.

6. The converter stage of claim 5, wherein the controller is further configured to provide the first control signal and the second control signal such that the first and second compensation switches, are closed after the first and second sampling switches are opened.

7. The converter stage of claim 5, wherein the controller is further configured to provide the second control signal with a delayed falling edge as compared to a falling edge of the first control signal.

8. The converter stage of claim 1, wherein the MDAC is further configured to amplify the residue.

9. A converter stage for a pipelined analog-to-digital converter (ADC), comprising:
    an ADC configured to convert a first sample of an analog signal into a digital value, wherein the ADC comprises a first sampling switch configured to couple the analog signal to a first hold capacitor to store the first sample of the analog signal on the first hold capacitor;
    a multiplying digital-to-analog converter (MDAC) configured to convert the digital value into an analog value and subtract the analog value from a second sample of the analog signal to provide a residue, wherein the MDAC comprises a second sampling switch configured to couple the analog signal to a second hold capacitor to store the second sample of the analog signal on the second hold capacitor; and
    a first compensation switch configured to equalize a voltage of the first sample of the analog signal on the first hold capacitor with a voltage of the second sample of the analog signal on the second hold capacitor.

10. The converter stage of claim 9, wherein the first compensation switch is coupled between a first terminal of the first hold capacitor and a first terminal of the second hold capacitor.

11. The converter stage of claim 9, further comprising a controller configured to provide a first control signal to control the first and second sampling switches and a second control signal to control the first compensation switch.

12. The converter stage of claim 11, wherein the controller is further configured to provide the first control signal and the second control signal such that the first compensation switch is closed after the first and second sampling switches are opened.

13. The converter stage of claim 11, wherein the controller is further configured to provide the second control signal with a delayed falling edge as compared to a falling edge of the first control signal.

14. A parallel sample-and-hold circuit, comprising:
    a first sampling switch configured to couple an analog signal to a first hold capacitor to store a first sample of the analog signal on the first hold capacitor;
    a second sampling switch configured to couple the analog signal to a second hold capacitor to store a second sample of the analog signal on the second hold capacitor; and
    a first compensation switch coupled between a first terminal of the first hold capacitor and a first terminal of the second hold capacitor, wherein the first compensation switch is configured to equalize a voltage of the first sample of the analog signal on the first hold capacitor with a voltage of the second sample of the analog signal on the second hold capacitor.

15. The parallel sample-and-hold circuit of claim 14, further comprising:
    a second compensation switch coupled between a second terminal of the first hold capacitor and a second terminal of the second hold capacitor.

16. The parallel sample-and-hold circuit of claim 15, wherein the first compensation switch is configured to equalize a voltage on the first terminal of the first hold capacitor with a voltage on the first terminal of the second hold capacitor.

17. The parallel sample-and-hold circuit of claim 15, wherein the second compensation switch is configured to equalize a voltage on the second terminal of the first hold capacitor with a voltage on the second terminal of the second hold capacitor.

18. The parallel sample-and-hold circuit of claim 15, further comprising a controller configured to provide a first control signal to control the first and second sampling switches and a second control signal to control the first and second compensation switches.

19. The parallel sample-and-hold circuit of claim 18, wherein the controller is further configured to provide the first control signal and the second control signal such that the first and second compensation switches are closed after the first and second sampling switches are opened.

20. The parallel sample-and-hold circuit of claim 18, wherein the controller is further configured to provide the second control signal with a delayed falling edge as compared to a corresponding falling edge of the first control signal.

* * * * *